United States Patent
Chung et al.

(10) Patent No.: US 6,900,136 B2
(45) Date of Patent: May 31, 2005

(54) METHOD FOR REDUCING REACTIVE ION ETCHING (RIE) LAG IN SEMICONDUCTOR FABRICATION PROCESSES

(75) Inventors: Chen-Kuei Chung, Hsinchu (TW); Hui-Chuan Lu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 322 days.

(21) Appl. No.: 10/094,288

(22) Filed: Mar. 8, 2002

(65) Prior Publication Data

US 2003/0171000 A1 Sep. 11, 2003

(51) Int. Cl.$^7$ ............................................. H01L 21/302
(52) U.S. Cl. ....................... 438/706; 438/700; 438/713; 216/41; 216/67
(58) Field of Search ................................. 438/700, 701, 438/705, 710, 712, 714, 706, 720; 216/41, 44, 54, 67, 57, 58

(56) References Cited

U.S. PATENT DOCUMENTS 5,473,186 A * 12/1995 Morita ........................ 257/519
6,372,655 B2 * 4/2002 Khan et al. .................. 438/714

* cited by examiner

Primary Examiner—Lan Vinh
(74) Attorney, Agent, or Firm—Akin Gump Strauss Hauer & Feld, LLP

(57) ABSTRACT

A method for reducing RIE lag (reaction ion etching lag) in a deep silicon etching process forming trench openings is described. The method can be carried out by either a photolithographic means wherein trench openings of the same planar area are patterned on the silicon substrate, or by a pressure means in which the chamber pressure during the reactive ion etching process is increased to reduce or eliminate the RIE lag effect. By increasing the chamber pressure at least 50% from that normally incurred in a reactive ion etching process, and preferably at least 100%, the RIE lag effect can be completely eliminated resulting in an inversed RIE lag in which a larger etch depth is achieved for the trench openings that have the smallest width.

18 Claims, 5 Drawing Sheets

APC: 70%, RIE LAG FREE, CIRCLE-RING

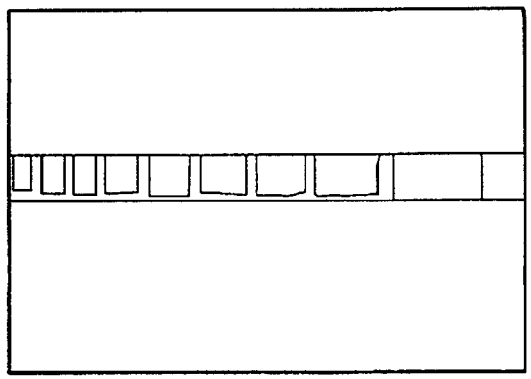
*APC: 30%, RIE LAG*
_Figure 10A_
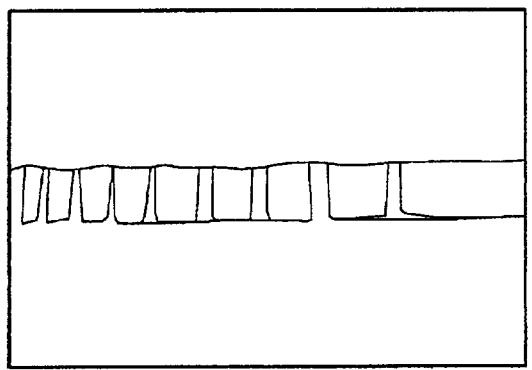
*APC: 70%, RIE LAG FREE, RECTANGLE*
_Figure 10B_
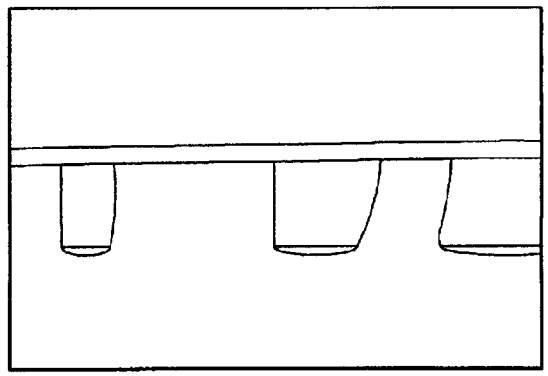
*APC: 70%, RIE LAG FREE, CIRCLE-RING*
_Figure 10C_

METHOD FOR REDUCING REACTIVE ION ETCHING (RIE) LAG IN SEMICONDUCTOR FABRICATION PROCESSES

FIELD OF THE INVENTION

The present invention generally relates to a method for reducing reactive ion etching (RIE) lag in a semiconductor fabrication process and more particularly, relates to a method for reducing RIE lag in a deep silicon etching process by forming photolithographically interconnection lines that have different widths but the same planar area, or by conducting the reactive ion etching process at a chamber pressure that is at least 50% higher than a normal chamber pressure used to carry out the RIE process.

BACKGROUND OF THE INVENTION

Reactive ion etching lag or RIE lag is a frequently seen defect in semiconductor fabrication processes when etching of a line in silicon or silicon oxide is desired. The RIE lag defect affects the etching dimension uniformity and thus the quality of the device fabricated. The RIE lag phenomenon occurs during a dry etching, or reactive ion etching process. The effect is more severe as the line width becomes smaller.

The cause of RIE lag is believed to be a problem occurring because etching rates and profiles depend on feature size and pattern density. RIE lag prevents the achievement of dimensional uniformity after the etching process. In general, microscopic uniformity problems can be grouped into two categories, i.e. aspect ratio dependent etching or pattern dependent etching, also known as microloading. Trench openings with a large aspect ratio etch more slowly than trench openings with a small aspect ratio. The RIE lag or microloading defect becomes more severe when semiconductor devices are fabricated in the sub-micron scale. The term "microloading" also refers to the dependency of etch rates on pattern density for identical features. Microloading results from depletion of reactants because the wafer has a local, higher density unmasked area.

A conventional RIE lag phenomenon is shown in FIGS. 1, 2 and 3. Data shown in these figures were obtained by deep reactive ion etching (DRIE) trenches (FIG. 1) of different sizes ranging between about 2.2 μm and about 5.5 μm. The etch rate measured was in a range between about 1.82 μm/min. and about 2.58 μm/min. The aspect ratios obtained on the trenches that have different lengths and widths are in-between values of 33.1 and 18.7. The reactive ion etching process was conducted by a reactant gas mixture of $SF_6$ at 120 sccm, $C_4F_8$ at 85 sccm for a reaction time of 40 min.

As shown in FIG. 1, the etch rate, or the depth of etch, is proportional to the trench size as expected due to RIE lag. The dependency of the etch rate on the trench size is plotted in FIG. 2, while the dependency of the etch rate on the aspect ratio is plotted in FIG. 3.

It is therefore an object of the present invention to provide a method for forming trench openings in semiconductor fabrication that has greatly reduced RIE lag problem.

It is another object of the present invention to provide a method for reducing reactive ion etching (RIE) lag in semiconductor fabrication processes by forming trench openings that have the same planar area.

It is a further object of the present invention to provide a method for reducing RIE lag in forming semiconductor trench openings in a reactive ion etch chamber.

It is another further object of the present invention to provide a method for reducing RIE lag in semiconductor trench forming processes by increasing the chamber pressure in a reactive ion etch chamber.

It is still another object of the present invention to provide a method for reducing RIE lag in a deep silicon etching process for forming trench openings by utilizing an etchant that includes $SF_6$.

It is yet another object of the present invention to provide a method for reducing RIE lag in a deep silicon etching process for forming trench openings by utilizing alternatingly an etchant gas and a passivation gas that includes $C_4F_8$.

SUMMARY OF THE INVENTION

In accordance with the present invention, a method for reducing RIE lag in a deep silicon etching process for forming trench openings is provided. The method can be carried out either photolithographically by defining trench openings that have the same planar area, or by processing a silicon substrate at a chamber pressure that is at least 50% higher than a normal chamber pressure that is used to carry out the RIE process.

In a preferred embodiment, a method for reducing RIE lag in a deep silicon etching process can be carried out by the operating steps of first providing an Si substrate that has a top planar surface; then patterning on the top planar surface at least two openings for at least two interconnect lines each has a different width of a first width $W_1$ and a second width $W_2$, and each has a different length of a first length $L_1$ and a second length $L_2$, wherein $W_1 \times L_1$ being substantially equal to $W_2 \times L_2$; and conducting a reactive ion etching process to form the at least two openings for the at least two interconnect lines.

In the method for reducing RIE lag in a deep silicon etching process, the $W_1$ and $W_2$ each has a value in the range between about 1 μm and about 100 μm. The $L_1$ and $L_2$ each has a value in the range between about 1 μm and about 1000 μm. The method may further include the step of flowing an etchant gas includes $SF_6$ onto the Si substrate when conducting the RIE process, or the step of alternatingly flowing an etchant gas and a passivation gas onto the Si substrate when conducting the RIE process. The passivation gas may include $C_4F_8$. The method may further include the step of flowing an etchant gas at a flow rate between about 5 scam and about 500 scam onto the Si substrate. The method may further include the step of flowing a passivation gas at a flow rate between about 10 scam and about 1000 sccm onto the Si substrate. The method may further include the step of adding $O_2$ at a flow rate of less than 100 scam into the etching gas. The method may further include the step of flowing the etchant gas and the passivation gas into an etch chamber to a chamber pressure between about 15 mTorr and about 50 mTorr.

The present invention is further directed to a method for reducing RIE lag in a deep silicon etching process which can be carried out by the operating steps of providing a reactive ion etching (RIE) chamber hermetically sealed from the environment; providing a silicon substrate that has a planar top surface; patterning at least two interconnect lines on the planar top surface of the silicon substrate each has a different line width; positioning the silicon substrate in the RIE chamber; and conducting the reactive ion etching process with an etchant gas at a preset chamber pressure that is at least 50% higher than a normal chamber pressure used to carry out the RIE process.

In the method for reducing RIE lag in a deep silicon etchant process, the etchant gas is a mixture of $SF_6$ and $O_2$ and the passivation gas is $C_4F_8$ which are flown alternatingly into the etch chamber. The method may further include the step of flowing, alternatingly, the etchant gas that includes $SF_6$ and $O_2$ and the passivation gas that includes $C_4F_8$ into the RIE chamber. The method may further include the step of flowing an etchant gas that includes $SF_6$ at a flow rate between about 5 sccm and about 500 sccm into the RIE chamber. The method may further include the step of flowing a passivation gas that includes $C_4F_8$ at a flow rate between about 10 sccm and about 1000 sccm into the RIE chamber, or the step of flowing $O_2$ at a flow rate of less than 100 sccm into the RIE chamber.

BRIEF DESCRIPTION OF THE DRAWINGS

These and other objects, features and advantages of the present invention will become apparent from the following detailed description and the appended drawings in which:

FIG. 10A is an enlarged, cross-sectional view of rectangular shaped trench openings in a silicon substrate illustrating RIE lag effect.

FIG. 10B is an enlarged, cross-sectional view of rectangular shaped trench openings in a silicon substrate etched at larger chamber pressure and RIE lag free.

FIG. 10C is an enlarged, cross-sectional view of circular shaped trench openings etched at high chamber pressure illustrating no RIE lag effect.

DETAILED DESCRIPTION OF THE PREFERRED EMBODIMENTS

The present invention discloses a method for reducing RIE lag in a deep silicon etch process for forming trench openings either of rectangular shape or of circular shape. The method can be carried out either in a photolithographic means for patterning trench openings that have substantially the same planar area, or by increasing the chamber pressure during the reactive ion etching process to eliminate the RIE lag.

In the method for reducing RIE lag by patterning photolithographically trench openings that have the same planar area, the method can be carried out by first providing a silicon substrate that has a top planar surface; then patterning on the top planar surface at least two openings for at least two interconnect lines, either in rectangular shape or in circular shape, each having a different width of a first width $W_1$ and a second width $W_2$, and each has a different length (or circumference) of a first length $L_1$ and a second length $L_2$ wherein $W_1 \times L_1$ being substantially equal to $W_2 \times L_2$; and conducting a reactive ion etching process to form the at least two openings for the at least two interconnect lines. The term "being substantially equal" in this writing indicates that a first value is within ±10% of the second value.

The method for reducing RIE lag in a deep silicon etching process by increasing the chamber pressure during RIE can be carried out by first providing a RIE chamber that is hermetically sealed from the environment; providing a silicon substrate that has a planar top surface; patterning at least two interconnect lines on the planar top surface of the silicon substrate each having a different line width; positioning the silicon substrate in the RIE chamber; and conducting the reactive ion etching process with an etchant gas at a preset chamber pressure that is at least 50% higher than a normal chamber pressure that is used to carry out the RIE process.

In applications where trench openings are formed in silicon substrates, a suitable etching gas may be a mixture of $SF_6$ and $O_2$ at a preset chamber pressure of at least 15 mTorr. The main component for the etchant gas is $SF_6$, while $C_4F_8$ acts as a passivation gas for coating the sidewalls of a trench opening with a polymeric protective layer and thus, allowing a deeper trench to be etched. In a preferred embodiment, the etchant gas mixture of $SF_6$ and $O_2$ may be flown into the RIE chamber at a flow rate between about 5 sccm and about 500 sccm, and alternatingly, the passivation gas of $C_4F_8$ may be flown into the RIE chamber at a flow rate between about 10 sccm and about 1000 sccm.

Figure 1:
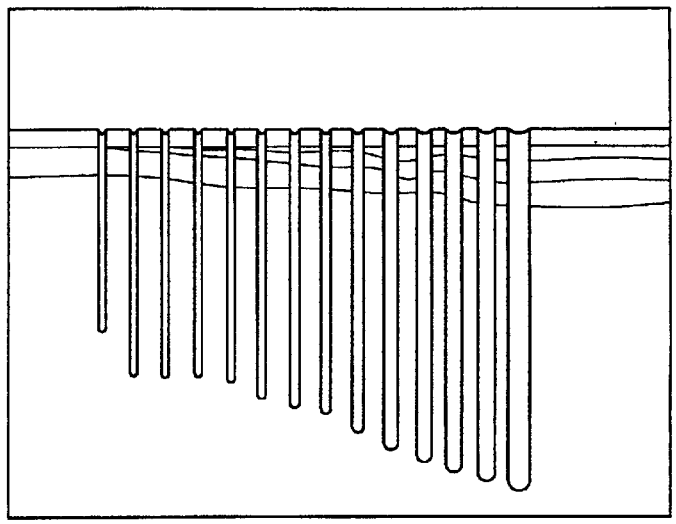
FIG. 1 is a graph illustrating an enlarged, cross-sectional view of a silicon substrate having trench openings of various widths formed therein showing the RIE lag effect.
Figure 2:
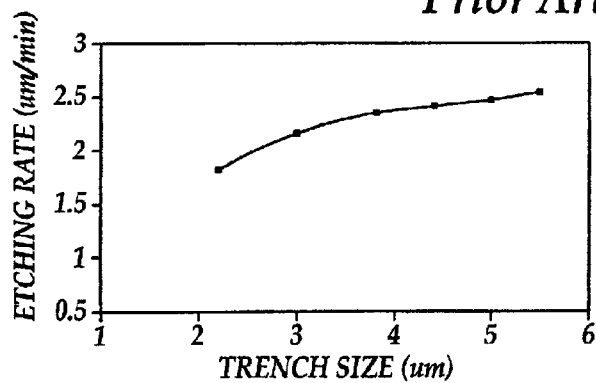
FIG. 2 is a graph illustrating the dependency of etch rate on the trench width for the various trench openings shown in FIG. 1.
Figure 3:
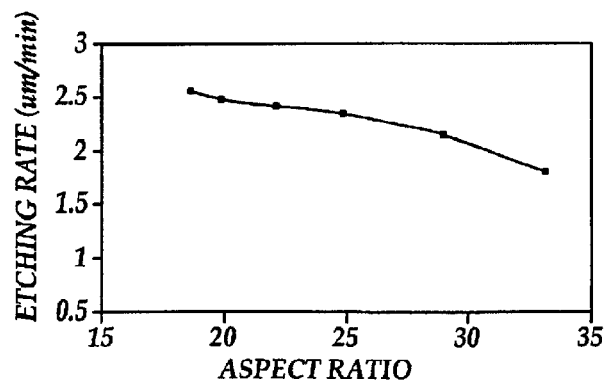
FIG. 3 is a graph illustrating the dependency of etch rate on the aspect ratio of the various trench openings shown in FIG. 1.
Figure 4:
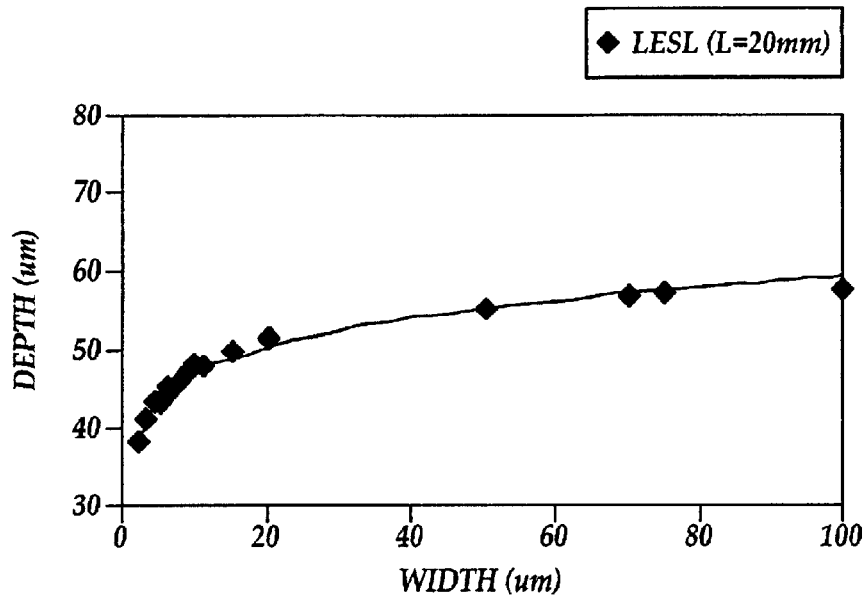
FIG. 4 is a graph illustrating the dependency of etch depth on the trench width when the length of the trench openings is fixed.

Referring now to FIG. 4, wherein a graph illustrating the dependency of the etch depth on the trench width is shown. The data plotted in this graph is obtained by a reactive ion etching process conducted in silicon substrate, with a $SF_6$ etchant gas flown at a flow rate of 120 sccm and a $C_4F_8$ passivation gas flown at a flow rate of 85 sccm. The reactive ion etching process is carried out for 30 min. with the auto pressure control (APC) valve adjusted at 50% opening, or approximately equivalent to a chamber pressure of 13–24 mTorr. The rectangular shaped trench openings each has the same length of 20 mm, but a different width between 2 $\mu$m and 100 $\mu$m. It is seen, from FIG. 4, that the etch depth, i.e. determined by the etch rate, is directly dependent on the trench opening width and increases from about 40 $\mu$m at a 2 $\mu$m width to about 60 $\mu$m at a 100 $\mu$m width. The data shown in FIG. 4 clearly demonstrates the width effect of the trench openings on the reactive ion etching process.

Figure 5:
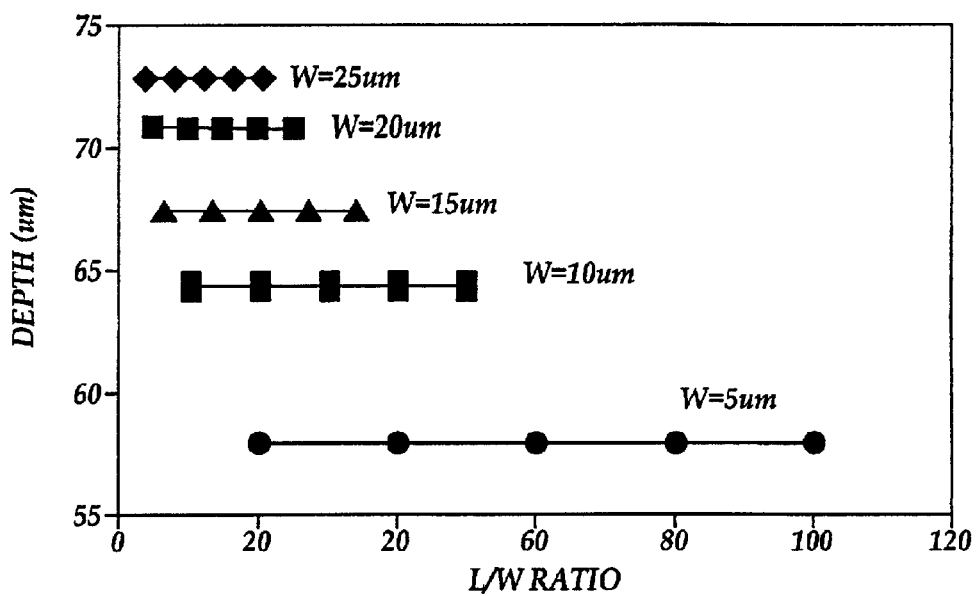
FIG. 5 is a graph illustrating the dependency of etch depth on the aspect ratio for trench openings with the same width and for trench openings with varying lengths.
Figure 5A:
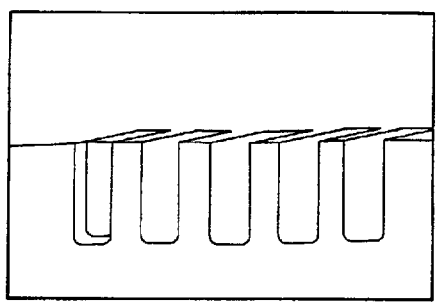
FIG. 5A is a graph illustrating an enlarged, cross-sectional view of a silicon substrate with trench openings formed of the same width, but with varying lengths.
Figure 5B:
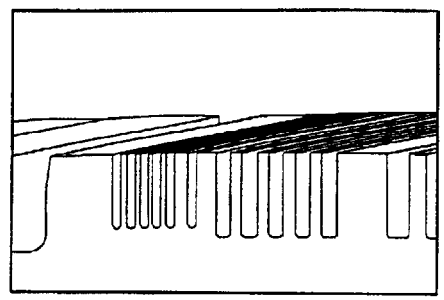
FIG. 5B is an enlarged, cross-sectional view of the silicon substrate illustrating trench openings having two different widths and varying lengths.

FIG. 5 illustrates a graph plotting the dependency of the etch depth on the aspect ratio, i.e. length/width ratio, of the trench openings that are shown in FIGS. 5A and 5B. The trench openings shown in FIG. 5A each have the same width of 25 μm, but a different length between about 100 μm and about 500 μm. Similarly, the rectangular shaped trench openings shown in FIG. 5B have a width of 5 μm (the openings on the left) and a width of 10 μm (the openings on the right), each having a different length between 100 μm and 500 μm.

It is clearly shown in FIG. 5 that the width of the trench openings is the major factor that affects the RIE lag phenomenon, and that length has almost no effect on the etch depth. For instance, each horizontal line is plotted of data obtained on trench openings having the same width, i.e. 25 μm, 20 μm, 15 μm, 10 μm and 5 μm, which has essentially constant etch depth at various length/width ratios, indicating that length has no effect on the RIE process.

Figure 6:
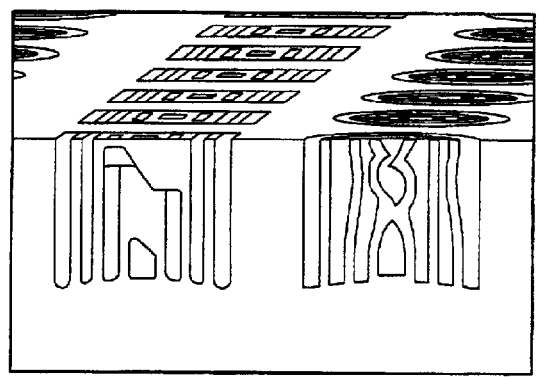
FIG. 6 is an enlarged, cross-sectional view of a silicon substrate illustrating circular shaped trench openings and rectangular shaped trench openings that have the same width, but different planar areas, resulting in RIE lag.

Instead of the rectangular shaped trench openings shown in FIGS. 4, 5, 5A and 5B, FIG. 6 illustrates the effect of RIE lag on circular shaped trench openings. The enlarged, cross-sectional view on the right-hand side of FIG. 6 shows circular shaped trench openings each having the same width, i.e. thus different planar surface areas, while the cross-sectional view on the left-hand side illustrates trench openings formed in continuous, rectangular shape also having the same width, and thus different planar surface areas. A serious RIE lag effect is seen in both cases, on the right and on the left side noticing a significant decrease in the etch depth for the center trench opening. The trench openings shown in FIG. 6 have a width of 5 μm, and varying lengths between 30 μm and 300 μm. The data in FIG. 6 therefore shows that the planar area, i.e. the planar top surface area, of the trench openings is a secondary factor that determines the RIE lag effect.

Figure 7:
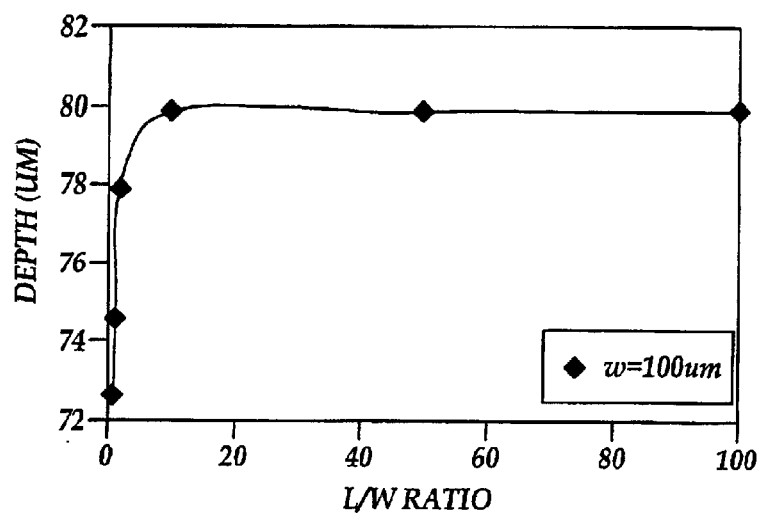
FIG. 7 is a graph illustrating the dependency of etch depth on the aspect ratio of trench openings that have the same width, but varying aspect ratios.

FIG. 7 is a graph illustrating the dependency of the etch depth on the length/width ratio of rectangular shaped trench openings. The trench openings in FIG. 7 were formed with the same width of 100 μm, but different length/width ratios between 0.5 and 100. It is seen in FIG. 7 that the length/width ratio has a small but insignificant effect on the RIE lag formation.

Figure 8A:
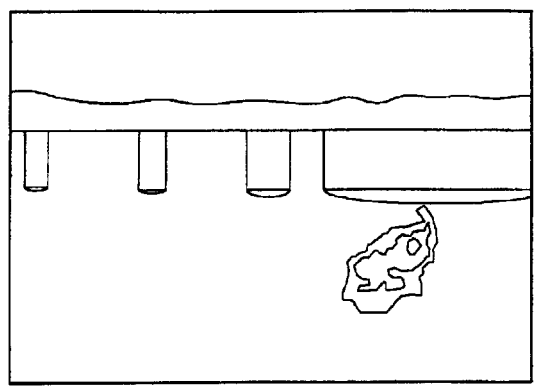
FIG. 8A is an enlarged, cross-sectional view of circular shaped trench openings that have the same planar area indicating a small RIE lag.
Figure 8B:
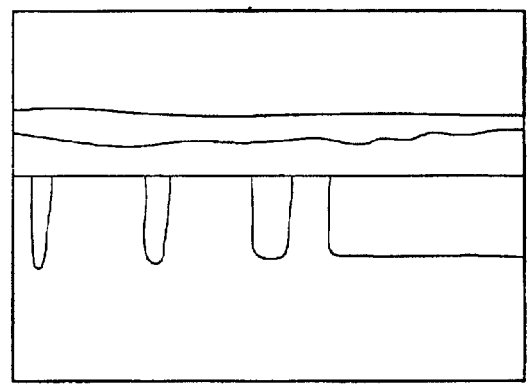
FIG. 8B is an enlarged, cross-sectional view of the circular shaped trench openings etched at higher chamber pressure illustrating inversed RIE lag.

FIGS. 8A and 8B are enlarged, cross-sectional views of circular shaped trench openings formed in a silicon substrate. FIG. 8A illustrates a RIE process carried out with the APC valve opened at 30%, representing a chamber pressure of about 10–20 mTorr and thus, showing a small RIE lag. The outer ring on the left achieved an etch depth of 25.34 μm, while the center trench opening (on the right) achieved an etch depth of 29.70 μm. This effect is essentially eliminated in the enlarged, cross-sectional view shown in FIG. 8B wherein the chamber pressure is increased by opening the butterfly pressure valve to 75% open, representing a chamber pressure of about 30–60 mTorr. An inversed RIE lag phenomenon is observed in that the trench opening of the smallest width achieved the largest etch depth of 40.39 μm, larger than that in the center trench opening of 34.45 μm. The RIE lag effect is therefore completely eliminated and moreover, the inversed RIE lag effect takes over to produce a larger etch depth for the trench openings of the smallest width. The inversed RIE lag effect is another unique discovery of the present invention that was not previously reported by others.

Figure 9A:
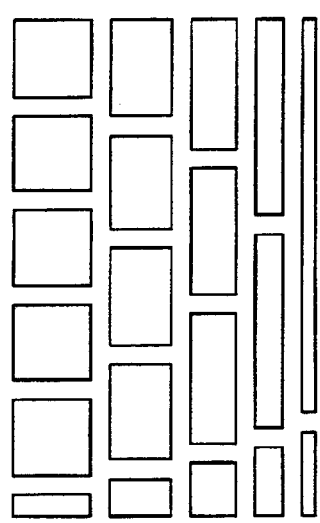
FIG. 9A is a plane view of various rectangular shaped trench openings having the same planar area.
Figure 9B:
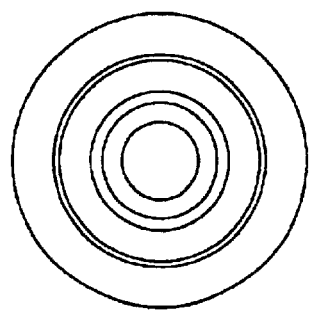
FIG. 9B is a plane view of circular shaped trench openings having the same planar area.

FIG. 9A is a plane view of a large number of rectangular shaped trench openings each having the same planar area of 2500 μm². Similarly, FIG. 9B is a plane view of four circular shaped trench openings each having the same planar area, i.e. the same planar top surface area. The numbers shown in FIG. 9B represent the inner and outer radius of each trench opening in μm units.

The present invention novel method for solving the RIE lag problem, i.e. for eliminating the RIE lag effect by increasing the chamber pressure, is further shown in FIGS. 10A, 10B and 10C. FIGS. 10A and 10B illustrate data obtained on rectangular shaped trench openings with FIG. 10A obtained at a chamber pressure of 10–20 mTorr, or with the butterfly pressure valve opened at 30%. A RIE lag effect is clearly shown in FIG. 10A. By increasing the chamber pressure by opening the auto pressure control (APC) valve to 70%, resulting in a chamber pressure of about 20–40 mTorr, the RIE lag effect is completely eliminated, as shown in FIG. 10B. Similarly, for a circular shaped trench opening shown in FIG. 10C, by increasing the APC valve to 70%, the RIE lag effect is eliminated as indicative by the same etch depth of 41.58 μm achieved in all three circular trench openings.

The present invention novel method for reducing RIE lag in forming trench openings, of either rectangular shape or of circular shape, in semiconductor fabrication have therefore been amply described in the above description and in the appended drawings of FIGS. 4–10C.

While the present invention has been described in an illustrative manner, it should be understood that the terminology used is intended to be in a nature of words of description rather than of limitation.

Furthermore, while the present invention has been described in terms of the two preferred embodiments, it is to be appreciated that those skilled in the art will readily apply these teachings to other possible variations of the inventions.

The embodiment of the invention in which an exclusive property or privilege is claimed are defined as follows.

What is claimed is:

1. A method for reducing RIE lag (reactive ion etching lag) in a deep silicon etching process comprising the steps of:

provide an Si substrate having a top planar surface;

patterning on said top planar surface at least two openings for at least two interconnect lines each having a different width of a first width $W_1$ and a second width $W_2$, and each having a different length of a first length $L_1$ and a second length $L_2$, wherein $W_1 \times L_1$ being substantially equal to $W_2 \times L_2$; and conducting a reactive ion etching process to form said at least two openings for said at least two interconnect lines.

2. A method for reducing RIE lag in a deep silicon etching process according to claim 1, wherein said $W_1$ and $W_2$ each having a value in the range between about 1 μm and about 100 μm.

3. A method for reducing RIE lag in a deep silicon etching process according to claim 1, wherein said $L_1$ and $L_2$ each having a value in the range between about 1 μm and about 1000 μm.

4. A method for reducing RIE lag in a deep silicon etching process according to claim 1 further comprising the step of flowing an etchant gas comprising $SF_6$ onto said Si substrate when conducting said RIE process.

5. A method for reducing RIE lag in a deep silicon etching process according to claim 1 further comprising the step of alternatingly flowing an etchant gas and a passivation gas onto said Si substrate when conducting said RIE process.

6. A method for reducing RIE lag in a deep silicon etching process according to claim 1, wherein said passivation gas comprises $C_4F_8$.

7. A method for reducing RIE lag in a deep silicon etching process according to claim 1 further comprising the step of flowing an etchant gas at a flow rate between about 5 sccm and about 500 sccm onto said Si substrate.

8. A method for reducing RIE lag in a deep silicon etching process according to claim 1 further comprising the step of flowing a passivation gas at a flow rate between about 10 sccm and about 1000 sccm onto said Si substrate.

9. A method for reducing RIE lag in a deep silicon etching process according to claim 5 further comprising the step of flowing $O_2$ at a flow rate of less than 100 sccm onto said Si substrate.

10. A method for reducing RIE lag in a deep silicon etching process according to claim 5 further comprising the step of alternatingly flowing said etchant gas and said passivation gas into an etch chamber to a chamber pressure between about 15 mTorr and about 50 mTorr.

11. A method for reducing RIE lag (reactive ion etching lag) in a deep silicon etching process comprising the steps of:

providing a reactive ion etching (RIE) chamber hermetically sealed from the environment;

providing a silicon substrate having a planar top surface;

patterning at least two interconnect lines on said planar top surface of said silicon substrate each having a different line width;

positioning said silicon substrate in said RIE chamber; and conducting said reactive ion etching process alternatingly with an etchant gas and a passivation gas at a preset chamber pressure that is at least 50% higher than a normal chamber pressure that is used to carry out said RIE process.

12. A method for reducing RIE lag in a deep silicon etchant process according to claim 11, wherein said etchant gas comprises $SF_6$ and said preset chamber pressure is at least 10 mTorr.

13. A method for reducing RIE lag in a deep silicon etchant process according to claim 11, wherein said passivation gas comprises $C_4F_8$ and said preset chamber pressure is at least 10 mTorr.

14. A method for reducing RIE lag in a deep silicon etchant process according to claim 11, wherein said etchant gas comprises $SF_6$ and $O_2$.

15. A method for reducing RIE lag in a deep silicon etchant process according to claim 11 further comprising the step of flowing said etchant gas comprising $SF_6$ and $O_2$ into said RIE chamber.

16. A method for reducing RIE lag in a deep silicon etchant process according to claim 11 further comprising the step of flowing an etchant gas comprising $SF_6$ at a flow rate between about 5 sccm and about 500 sccm into said RIE chamber.

17. A method for reducing RIE lag in a deep silicon etchant process according to claim 11 further comprising the step of flowing a passivation gas comprising $C_4F_8$ at a flow rate between about 10 sccm and about 1000 sccm into said RIE chamber.

18. A method for reducing RIE lag in a deep silicon etchant process according to claim 11 further comprising the step of flowing $O_2$ at a flow rate of less than 100 sccm into said RIE chamber.

* * * * *